United States Patent
Kidoh

(10) Patent No.: US 7,915,784 B2
(45) Date of Patent: Mar. 29, 2011

(54) SURFACE ACOUSTIC WAVE RESONATOR AND SURFACE ACOUSTIC WAVE DEVICE IN WHICH SPURIOUS RESPONSES THAT OCCUR WHEN A SIO₂ PROTECTIVE FILM IS PROVIDED ARE SUPPRESSED

(75) Inventor: Hideo Kidoh, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/470,549

(22) Filed: May 22, 2009

(65) Prior Publication Data

US 2009/0230816 A1 Sep. 17, 2009

Related U.S. Application Data

(63) Continuation of application No. PCT/JP2007/070694, filed on Oct. 24, 2007.

(30) Foreign Application Priority Data

Nov. 29, 2006 (JP) .................. 2006-321659

(51) Int. Cl.
*H03H 9/25* (2006.01)
(52) U.S. Cl. ............... 310/313 A; 310/313 R
(58) Field of Classification Search ........... 310/313, 310/348
See application file for complete search history.

(56) References Cited

U.S. PATENT DOCUMENTS

| | | | | |
|---|---|---|---|---|
| 4,480,148 A * | 10/1984 | Archer | ......... | 310/313 R |
| 6,940,208 B2 * | 9/2005 | Kando | ......... | 310/313 R |
| 7,132,779 B2 * | 11/2006 | Kando | ......... | 310/313 R |
| 2002/0074899 A1 | 6/2002 | Nakao et al. | | |
| 2006/0145568 A1 | 7/2006 | Morita et al. | | |

FOREIGN PATENT DOCUMENTS

| | | |
|---|---|---|
| JP | 10-163802 A | 6/1998 |
| JP | 11-017485 A | 1/1999 |
| JP | 11-055068 A | 2/1999 |
| JP | 2002-135077 A | 5/2002 |
| JP | 2002-261571 A | 9/2002 |
| JP | 2006-165746 A | 6/2006 |

OTHER PUBLICATIONS

Official Communication issued in International Patent Application No. PCT/JP2007/070694, mailed on Dec. 4, 2007.
Official Communication issued in the counterpart Japanese Application No. 2008-546915, mailed on Mar. 31, 2009.

* cited by examiner

*Primary Examiner* — J. SanMartin
(74) *Attorney, Agent, or Firm* — Keating & Bennett, LLP

(57) ABSTRACT

A surface acoustic wave resonator includes a rotated Y-cut quartz substrate with a cut angle θ of about −53° to about −52° and an IDT electrode made of aluminum or an alloy primarily including aluminum provided on the quartz substrate. The propagation direction of surface acoustic waves is within a range of about 90°±5° with respect to the X axis. A SiO₂ film is arranged to cover the quartz substrate and the IDT electrode. The thickness of the IDT electrode is in a range of about 6.0% to about 6.5% of λ, where λ is the wavelength of surface acoustic waves, and the duty ratio of the IDT electrode is in a range of about 0.62 to about 0.66.

4 Claims, 6 Drawing Sheets

SURFACE ACOUSTIC WAVE RESONATOR AND SURFACE ACOUSTIC WAVE DEVICE IN WHICH SPURIOUS RESPONSES THAT OCCUR WHEN A SIO₂ PROTECTIVE FILM IS PROVIDED ARE SUPPRESSED

BACKGROUND OF THE INVENTION

1. Field of the Invention

The present invention relates to surface acoustic wave resonators including quartz substrates. In particular, the present invention relates to a surface acoustic wave resonator in which a $SiO_2$ film covers an IDT electrode, and a surface acoustic wave device including such a surface acoustic wave resonator.

2. Description of the Related Art

Surface acoustic wave devices are widely used in cellular phones and in vehicle-mountable electronic appliances. A surface acoustic wave device includes a piezoelectric substrate and an IDT electrode provided on the piezoelectric substrate. Various piezoelectric single crystals and piezoelectric ceramics are used as the materials for the piezoelectric substrate.

Japanese Unexamined Patent Application Publication No. 2006-165746 describes a surface acoustic wave device, which has an IDT electrode made of Al or an alloy primarily including Al, disposed on a quartz substrate. FIG. 11 is a cross-sectional view schematically showing a surface acoustic wave device described in Japanese Unexamined Patent Application Publication No. 2006-165746.

A surface acoustic wave device 101 includes a packaging member 102 having an opening that opens upward. A surface acoustic wave resonator 103 is disposed in the opening. In other words, the surface acoustic wave resonator 103 is mounted on a bottom surface inside the opening of the packaging member 102.

The surface acoustic wave resonator 103 has a rotated Y-cut quartz substrate 104 which has a cut angle θ of −64.0°<θ<−49.3°. An IDT electrode 105 and reflectors 106 and 107 arranged on two sides of the IDT electrode 105 in the surface acoustic wave propagation direction are provided on the quartz substrate 104. The IDT electrode 105 is arranged so that the surface acoustic wave propagation direction is 90° with respect to the X axis. The IDT electrode 105 and the reflectors 106 and 107 are made of aluminum and have a thickness of 0.04λ to 0.12λ, where λ is the wavelength of the surface acoustic waves. The duty ratio of the IDT electrode 105 is set to 0.5 to 0.65.

The opening in the surface acoustic wave device 101 in which the surface acoustic wave resonator 103 is disposed is covered with a cover member not shown in the drawing to hermetically seal the surface acoustic wave resonator 103.

The surface acoustic wave device 101 can have a lower capacity ratio to enhance frequency controllability by setting the cut angle θ of the quartz substrate 104 within the above-described specific range and by adjusting the thickness and the duty ratio of the IDT electrode within the above-described specific ranges.

Japanese Unexamined Patent Application Publication No. 2006-165746 also discloses that a protective film made of a $SiO_2$ film or a protective film made of anodized aluminum may be arranged to cover the IDT electrode.

Japanese Unexamined Patent Application Publication No. 2002-135077 discloses that aluminum and alloys primarily including aluminum are widely used as materials for IDT electrodes of surface acoustic wave devices. Japanese Unexamined Patent Application Publication No. 2002-135077 describes problems that arise in this type of surface acoustic wave devices. The problems include the generation of a transverse mode caused by the IDT defining a waveguide and the generation of ripples caused by the transverse mode in the pass band. The invention disclosed in Japanese Unexamined Patent Application Publication No. 2002-135077 provides a structure that can reduce the transverse mode ripple. In particular, an IDT electrode defined by an electrode having a larger load effect than aluminum is provided on a quartz substrate, and the metallization ratio d and the normalized thickness h/λ of the IDT are controlled to reduce the transverse mode ripple to 0.5 dB or less, where the metallization ratio of the IDT electrode is represented by d and the electrode thickness is represented by h. In other words, Japanese Unexamined Patent Application Publication No. 2002-135077 discloses that the transverse mode ripple can be suppressed by providing an IDT electrode that is made of an electrode material, such as tantalum, that has a mass greater than that of aluminum on a quartz substrate and by adjusting the metallization ratio d and the electrode thickness h of the IDT electrode in the specific ranges.

Japanese Unexamined Patent Application Publication No. 2006-165746 describes that the surface acoustic wave device 101 may include a protective film made of $SiO_2$ or anodized aluminum to protect the IDT electrode. However, it has been found that, with respect to the surface acoustic wave device described in Japanese Unexamined Patent Application Publication No. 2006-165746, if a $SiO_2$ protective film covering the IDT electrode is actually provided on a quartz substrate, large spurious responses are generated between the resonance frequency and anti-resonance frequency.

In a surface acoustic wave device described in Japanese Unexamined Patent Application Publication No. 2002-135077, an IDT electrode is made of an electrode material having a mass load effect that is larger than that of aluminum and the metallization ratio d of the IDT electrode and the normalized thickness of the IDT electrode are adjusted within specific ranges, as described above, to suppress the transverse mode spurious responses. However, Japanese Unexamined Patent Application Publication No. 2002-135077 does not disclose the formation of a protective film made of $SiO_2$. In other words, the configuration described in Japanese Unexamined Patent Application Publication No. 2002-135077 is designed to suppress transverse mode spurious responses in a surface acoustic wave device that includes a quartz substrate, but not a $SiO_2$ film, and an IDT electrode made of aluminum on the substrate. Thus, a way to suppress spurious responses whose exact cause is unknown and which occur when a $SiO_2$ protective film is provided on a surface acoustic wave device having an aluminum IDT electrode as described in Japanese Unexamined Patent Application Publication No. 2006-165746 has not previously been known or disclosed.

SUMMARY OF THE INVENTION

To overcome the problems described above, preferred embodiments of the present invention provide a surface acoustic wave resonator including a piezoelectric quartz substrate, an IDT electrode made of aluminum or an alloy primarily including aluminum provided on the quartz substrate, and a protective film including a $SiO_2$ film, in which spurious responses that occur when a protective film made of a $SiO_2$ film is provided can be effectively suppressed, and thus, good frequency characteristics can be achieved, and a surface acoustic wave device including the surface acoustic wave resonator.

A surface acoustic wave resonator according to a preferred embodiment of the present invention preferably includes a rotated Y-cut quartz substrate having a cut angle θ of about −53° to about −52°, an IDT electrode provided on a main surface of the quartz substrate, the IDT electrode being made of aluminum or an alloy primarily including aluminum, and a SiO$_2$ film arranged to cover the main surface of the quartz substrate and the IDT electrode, in which a propagation direction of surface acoustic waves is within the range of about 90°±5° with respect to the X axis, a thickness of the IDT electrode is in the range of about 6.0% to about 6.5% of λ, where λ is the wavelength of surface acoustic waves propagating in the quartz substrate, and a duty ratio of the IDT electrode is in the range of about 0.62 to about 0.66, for example.

Preferably, the thickness of the SiO$_2$ film is in the range of about 20 nm to about 70 nm, for example. A surface acoustic wave device according to a preferred embodiment of the present invention includes the surface acoustic wave resonator described above and a packaging member that hermetically seals the surface acoustic wave resonator. In the surface acoustic wave device according to this preferred embodiment of the present invention, the packaging member preferably includes a package main body having an opening in which the surface acoustic wave resonator is disposed, and a cover arranged to close the opening of the package main body, the surface of the cover being coated with a conductive material. In such a case, even when a portion of the conductive coating of the cover scatters and the conductive material defining the conductive coating scatters toward the surface acoustic wave resonator-side during assembly of the package, fluctuations of characteristics caused by the conductive material and short circuits are prevented since the IDT electrode is covered with the SiO$_2$ film. Accordingly, spurious responses that occur when the SiO$_2$ film is provided can be prevented, degradation of the insertion loss can be prevented, and a surface acoustic wave device having high reliability can be provided.

A surface acoustic wave resonator according to a preferred embodiment of the present invention includes a rotated Y-cut quartz substrate having a cut angle θ of about −53° to about −52°, an IDT electrode provided on a main surface of the quartz substrate, the IDT electrode being made of aluminum or an alloy primarily including aluminum, and a SiO$_2$ film arranged to the main surface of the quartz substrate and the IDT electrode. In this resonator, the propagation direction of surface acoustic waves is within the range of about 90°±5° with respect to the X axis, the thickness of the IDT electrode is in the range of about 6.0% to about 6.5% of the wavelength of surface acoustic waves, and the duty ratio is in the range of about 0.62 to about 0.66, for example. Thus, spurious responses whose exact cause is unknown and which occur at a high temperature of about 85° C. to about 125° C. when the SiO$_2$ film is provided can be effectively prevented, and degradation of the insertion loss can also be prevented. Thus, a highly reliable, low-loss surface acoustic wave resonator in which spurious responses do not readily occur in a wide temperature range of about −40° C. to about 125° C., for example, is provided. Thus, the surface acoustic wave resonator according to various preferred embodiments of the present invention is suitable as a resonator for use in a wide temperature range, e.g., an oscillator of a keyless entry system for automobiles and a resonator of a tire-pressure monitoring system.

Other features, elements, arrangements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described with reference to the drawings.

Figure 1A:
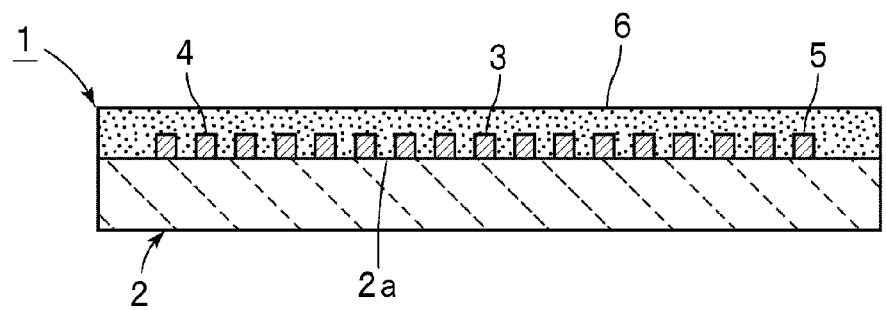
FIG. 1A is a front cross-sectional view of a surface acoustic wave resonator according to a preferred embodiment of the present invention.
Figure 1B:
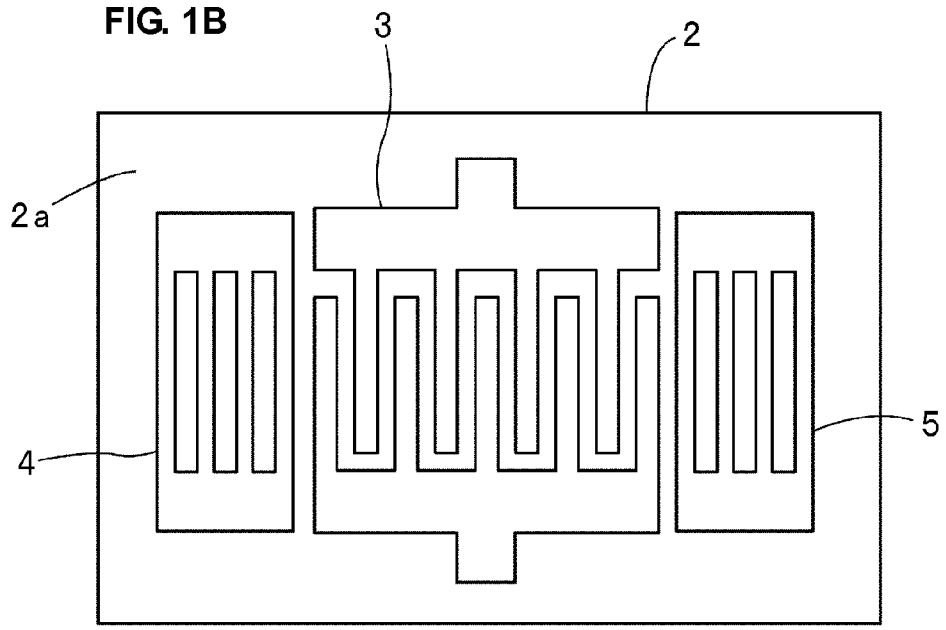
FIG. 1B is a schematic plan view showing an electrode structure.

FIG. 1A is a front cross-sectional view of a surface acoustic wave resonator according to a preferred embodiment of the present invention and FIG. 1B is a schematic plan view showing an electrode structure.

A surface acoustic wave resonator 1 includes a quartz substrate 2. The quartz substrate 2 is preferably a rotated Y-cut quartz substrate with a cut angle θ of about −53° to about −52°, for example.

An IDT electrode 3 and reflectors 4 and 5 respectively disposed at the opposite sides of the IDT electrode 3 in the surface acoustic wave propagation direction are provided on the quartz substrate 2. The IDT electrode 3 and the reflectors 4 and 5 are preferably made of aluminum, for example. Alternatively, an alloy primarily including aluminum may preferably be used instead of aluminum. An "alloy primarily including aluminum" refers to an aluminum-based alloy whose aluminum content is at least about 50 percent by weight.

The thickness of the IDT electrode 3 is preferably set in the range of about 6.0% to about 6.5%, for example, of the wavelength λ, i.e., the wavelength of oscillated surface acoustic waves. The duty ratio is preferably set in the range of about 0.62 to about 0.66, for example.

A $SiO_2$ film 6 is arranged on an upper surface of the quartz substrate 2 to cover the IDT electrode 3. The $SiO_2$ film 6 defines a protective film that insulates and covers the IDT electrode 3 and the reflectors 4 and 5. The surface acoustic wave resonator 1 is preferably housed in a packaging member and hermetically sealed as with a surface acoustic wave device 10 described below, for example. During the assembly of the surface acoustic wave device, if conductive powder scatters from the materials defining other components and is disposed on the IDT electrode, the characteristics may fluctuate and short-circuits may occur. The $SiO_2$ film 6 is arranged to define a protective film which prevents such characteristics fluctuation and short-circuits.

To provide protection, the thickness of the $SiO_2$ film is preferably about 20 nm to about 70 nm, for example, when the surface acoustic wave resonator 1 is used in the 100 MHz to 800 MHz band, for example. A $SiO_2$ film having a thickness less than about 20 nm may not provide a protective effect to prevent the short circuits. At a thickness exceeding about 70 nm, the insertion loss tends to increase due to the mass load of the $SiO_2$ film.

The inventor of the present invention has discovered that when the $SiO_2$ film is provided, although spurious responses do not occur in the characteristics curves at normal temperatures, large spurious responses arise between the resonance point and the anti-resonance point at a temperature of about 125° C. This finding is described below by referring to specific experimental examples.

Figure 3:
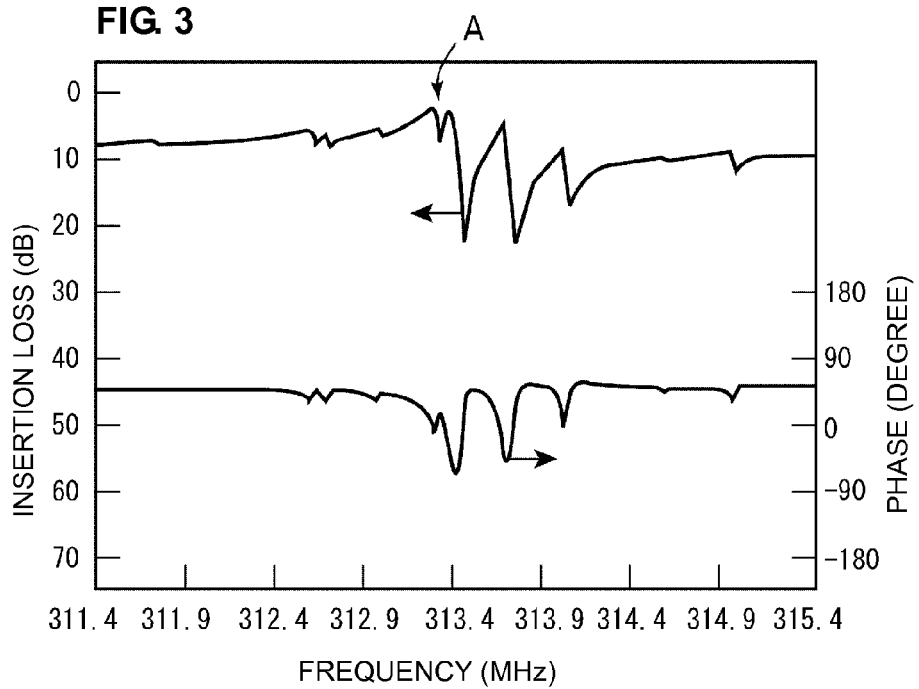
FIG. 3 is a graph showing the transmission characteristic and phase characteristic to describe spurious responses at a normal temperature when the thickness of the IDT electrode made of aluminum is up to about 7.8% of the wavelength of the surface waves.

An IDT electrode 3 made of aluminum was provided on a quartz substrate having a cut angle θ of about −52°30' which defines the quartz substrate 2. The IDT electrode 3 included 110 electrode finger pairs arranged at an aperture of about 40λ and a wavelength λ of about 7.635 μm, for example. The number of electrode fingers was 45 for each of the reflectors 4 and 5. The thickness of the IDT electrode 3 and the reflectors 4 and 5 was about 7.8% of the wavelength λ, for example. The duty ratio of the IDT electrode was about 0.65 and the thickness of the $SiO_2$ film was about 40 nm, for example. The transmission (amplitude) characteristic and the phase characteristic of a surface acoustic wave resonator of a Comparative Example prepared as such, at normal temperature, i.e., about 25° C., are shown in FIG. 3. As shown in FIG. 3, a large spurious response indicated by arrow A occurs between the resonance and anti-resonance even at normal temperature. If such a surface acoustic wave resonator is used in an oscillation circuit, a frequency jump and abnormal oscillation occur and the reliability of the oscillation circuit is degraded.

Figure 4:
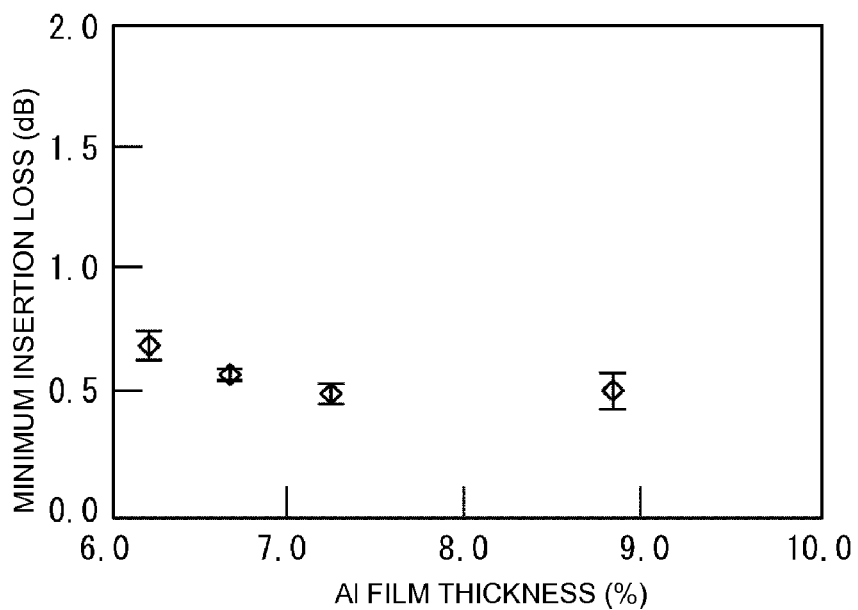
FIG. 4 is a graph showing the relationship between the thickness of the IDT electrode made of aluminum and the insertion loss.

FIG. 4 is a graph showing changes in insertion loss when the thickness of the IDT electrode made of aluminum is changed in a surface acoustic wave resonator that does not include a $SiO_2$ film.

As shown in FIG. 4, when the thickness of the IDT electrode is less than about 6.0% of the wavelength λ, the energy of surface waves are not sufficiently confined and the insertion loss is increased. Thus, a large reflector is required to obtain a surface acoustic wave resonator with a low loss when the thickness of the IDT electrode is less than about 6% of the wavelength λ. As a result, the size of the surface acoustic wave resonator is disadvantageously increased. In order to achieve size reduction of the surface acoustic wave resonator, the thickness of the IDT electrode must be at least about 6.0% of the wavelength λ.

As shown in FIG. 4, when the thickness of the IDT electrode made of aluminum is at least about 6.0% of the wavelength λ, the insertion loss remains substantially unchanged up to about 8.8%.

Figure 5:
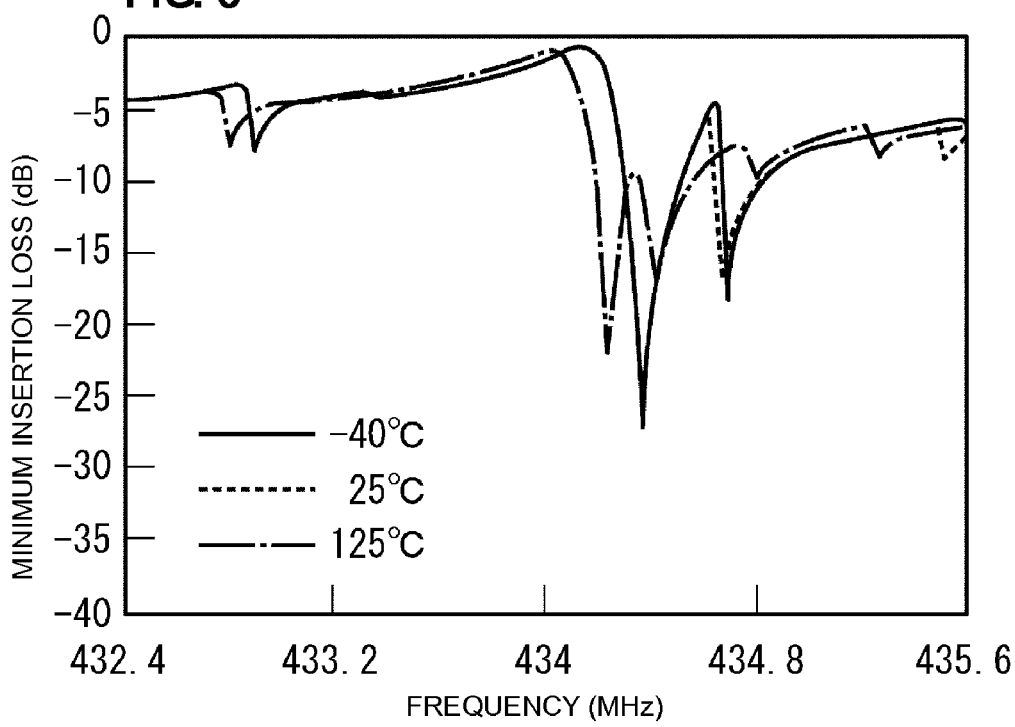
FIG. 5 is a graph showing the transmission characteristics at about −40° C., about 25° C., and about 125° C. of a surface acoustic wave resonator in which the thickness of the IDT electrode composed of aluminum is about 6.8% of the wavelength of the surface waves and no SiO$_2$ film is provided.

The transmission characteristic of the surface acoustic wave resonator including an IDT electrode having a thickness of about 6.8% of the wavelength λ and no $SiO_2$ film was measured at about −40° C., about 25° C., and about 125° C. The results are shown in FIG. 5. Next, the $SiO_2$ film 6 having a thickness of about 40 nm was provided and the impedance characteristic thereof was measured in the same manner at about −40° C., about 25° C., and about 125° C. The results are shown in FIG. 6.

Figure 6:
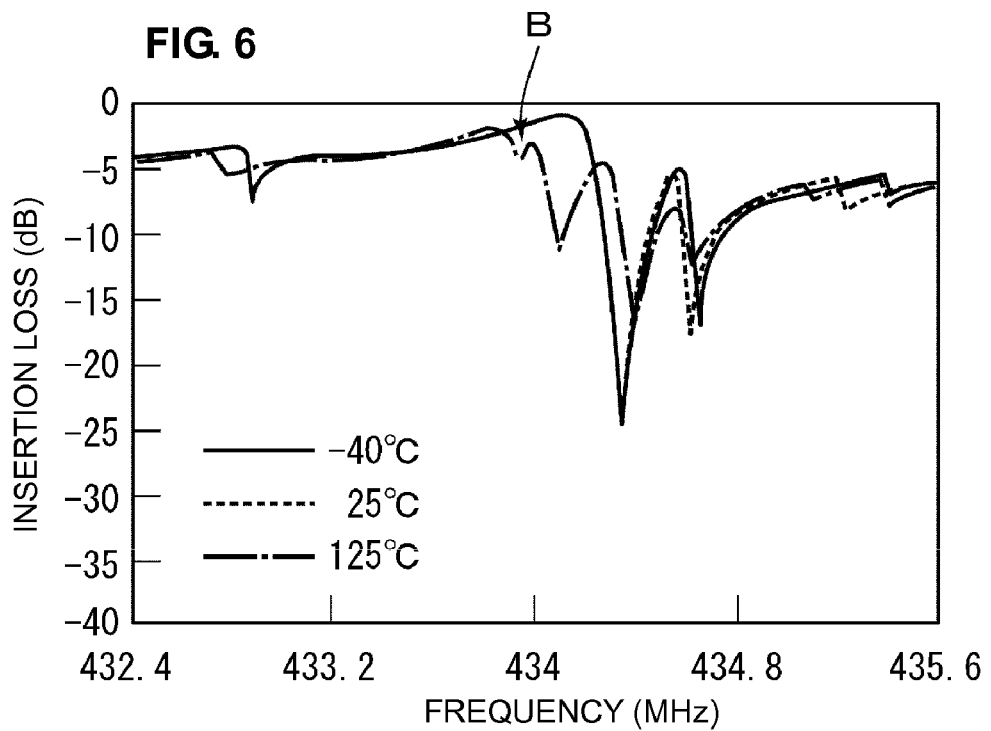
FIG. 6 is a graph showing the transmission characteristics at about −40° C., about 25° C., and about 125° C. of a surface acoustic wave resonator in which the thickness of the IDT electrode composed of aluminum is about 6.8% of the wavelength of the surface waves and the thickness of the SiO$_2$ film is about 40 nm.

In FIGS. 5 and 6, when a broken line indicating the impedance at about 25° C. overlaps a solid line indicating the impedance at about −40° C., the overlapping portion is indicated by a solid line.

As the comparison between FIG. 5 and FIG. 6 clearly shows, the graph in FIG. 5 in which no $SiO_2$ film was provided, no spurious response was observed at a normal temperature (about 25° C.) and no significant spurious response was observed at a high temperature, i.e., about 125° C.

In contrast, it was discovered that when the $SiO_2$ film was provided, as shown in FIG. 6, although spurious responses did not appear at a normal temperature, a large spurious response indicated by arrow B appeared between the resonance point and the anti-resonance point at a high temperature of about 125° C.

Figure 7:
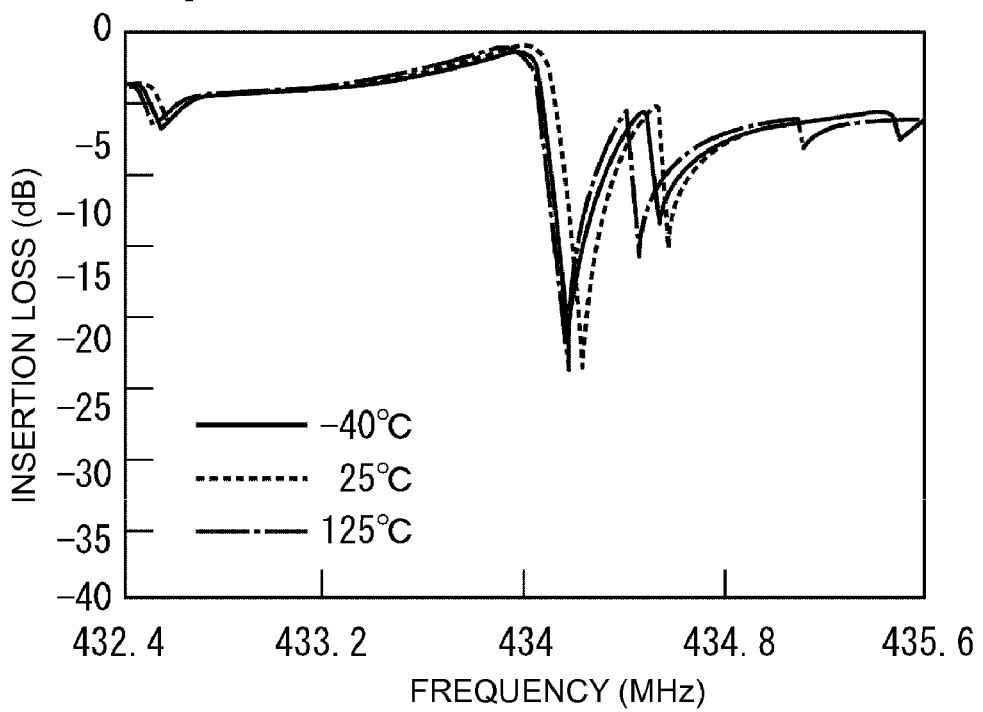
FIG. 7 is a graph showing the transmission characteristics at about −40° C., about 25° C., and about 125° C. of a surface acoustic wave resonator according to a preferred embodiment of the present invention, in which the thickness of the IDT electrode made of aluminum is about 6.3% of the wavelength of the surface waves, the duty ratio is about 0.64, and the thickness of the SiO$_2$ film is about 40 nm.

Next, in a resonator having a $SiO_2$ film with a thickness of about 40 nm, the thickness of the IDT electrode made of aluminum was changed from about 6.8% to about 6.3% of the wavelength λ, and the transmission characteristic of the surface acoustic wave resonator was measured at about −40° C., about 25° C., and about 125° C. in a similar manner. The results are shown in FIG. 7. As shown in FIG. 7, the spurious response at a high temperature, i.e., about 125° C., could be suppressed by decreasing the thickness of the IDT electrode made of aluminum.

Figure 8:
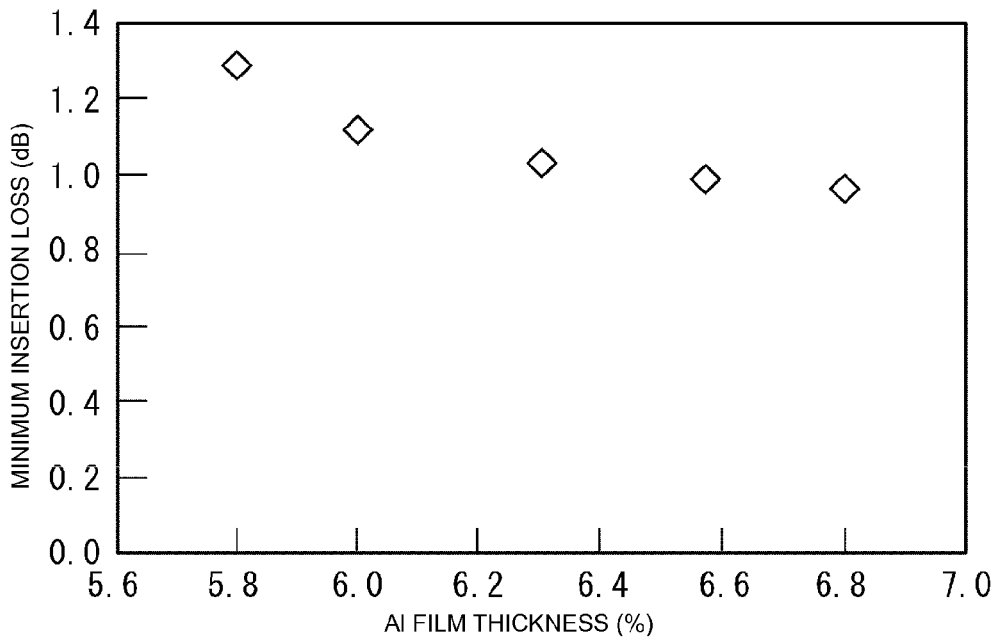
FIG. 8 is a graph showing changes in insertion loss with changes in thickness of the IDT electrode made of aluminum when the thickness of the SiO$_2$ film is about 40 nm and the duty ratio of the IDT electrode is about 0.59.

Since it appeared more preferable to decrease the thickness of the IDT electrode made of aluminum, the thickness of the IDT electrode made of aluminum was changed to a variety of values, i.e., about 5.8%, about 6.0%, about 6.3%, about 6.6%, and about 6.8%, and changes in the insertion loss were observed while fixing the thickness of the $SiO_2$ film at about 40 nm. The results are shown in FIG. 8. The minimum insertion loss was measured by setting the thickness of the IDT electrode to about 6.3% of the wavelength λ and fixing the thickness of the $SiO_2$ film to about 40 nm while varying the duty ratio of the IDT electrode to a variety of values, i.e., about 0.59, about 0.61, about 0.62, about 0.63 and about 0.65. The results are shown in FIG. 9.

As shown in FIG. 8, the minimum insertion loss increased as the thickness of the IDT electrode decreased, which indicates that a resonator provided in an oscillation circuit will consume more power.

Figure 9:
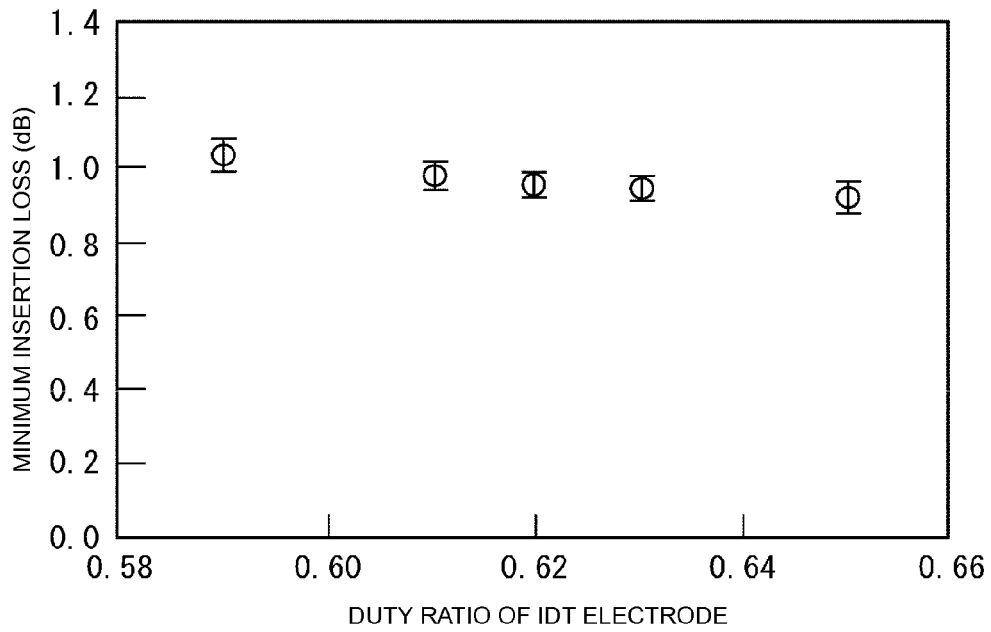
FIG. 9 is a graph showing changes in minimum insertion loss with changes in duty ratio of the IDT electrode when the thickness of the IDT electrode is about 6.3% of the wavelength of surface waves and the thickness of the SiO$_2$ film is about 40 nm.

FIG. 9 shows that the increase in minimum insertion loss caused by decreasing the thickness of the IDT electrode composed of aluminum from about 6.8% to about 6.3%, for example, can be compensated for by changing the duty ratio from about 0.59 to about 0.64, for example. This is because increasing the duty ratio can increase the amount of reflected surface waves per electrode finger.

Degradation of the insertion loss should be suppressed while avoiding the reoccurrence of spurious responses. However, when the degradation of insertion loss is suppressed by increasing the duty ratio, the occurrence of a spurious response at high temperature can be suppressed. In other words, as shown in FIG. 7, when the thickness of the IDT electrode made of aluminum is about 6.3% of the wavelength $\lambda$, the spurious response at a high temperature can be effectively suppressed and degradation of the insertion loss can be prevented by increasing the duty ratio to about 0.64, even when the $SiO_2$ film is provided.

Next, the thickness of the IDT electrode made of aluminum was set to about 5.8%, about 6.3%, and about 6.8% of the wavelength $\lambda$ and the thickness of the $SiO_2$ film was varied to make a plurality of types of surface acoustic wave devices. The minimum insertion losses of the plurality of types of surface acoustic wave resonators were determined. The results are shown in FIG. 10.

Figure 10:
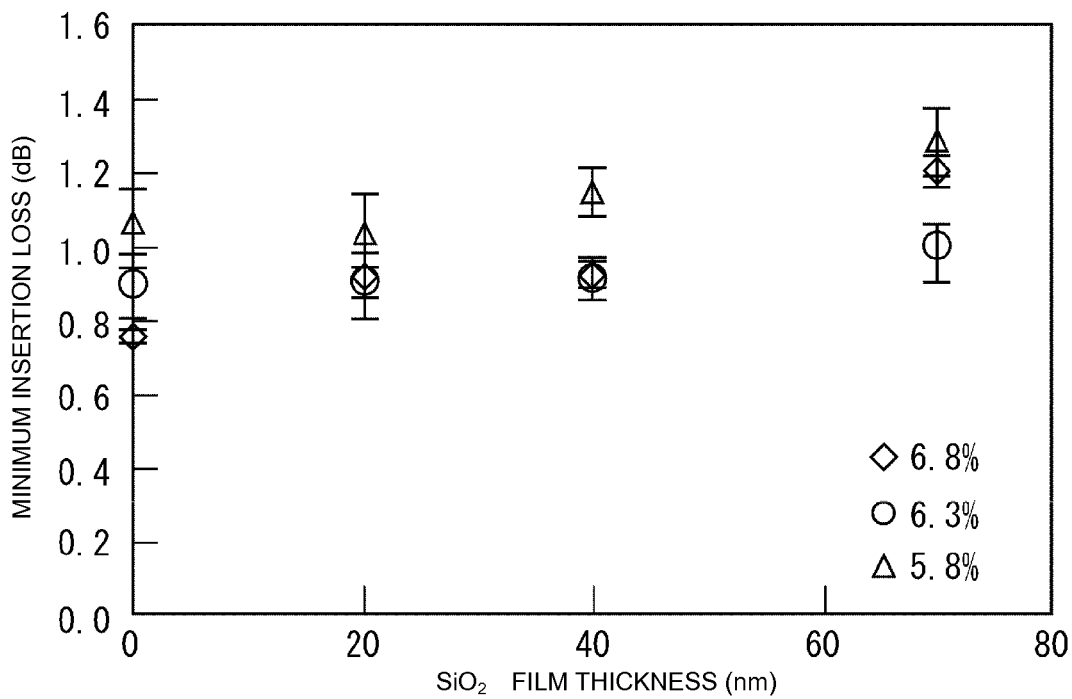
FIG. 10 is graph showing the relationship between the thickness of the SiO$_2$ film and the minimum insertion loss when the thickness of the IDT electrode is about 5.8%, about 6.3%, or about 6.8%.
Figure 11:
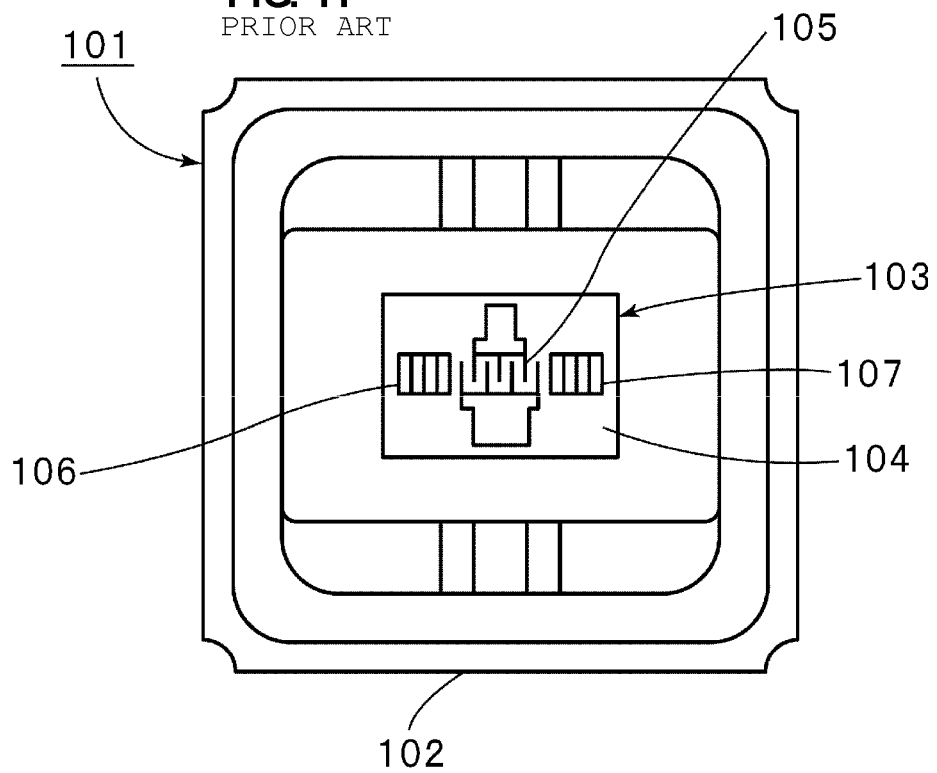
FIG. 11 is a front view of one example of a surface acoustic wave device of related art.

As shown in FIG. 10, when the thickness of the $SiO_2$ film is 0, i.e., when no $SiO_2$ film is provided, the minimum insertion loss when the thickness of the IDT electrode made of aluminum is 6.3% of the wavelength $\lambda$ is slightly greater than the minimum insertion loss when the thickness is about 6.8% of the wavelength $\lambda$. However, when the $SiO_2$ film is provided and the thickness of the $SiO_2$ film is up to about 70 nm, the minimum insertion loss is less when the thickness of the IDT electrode is about 6.3% of the wavelength $\lambda$ than when the thickness of the IDT electrode is about 6.8% of the wavelength $\lambda$.

For a structure including a $SiO_2$ film, the thickness is preferably at least about 20 in order to protect the IDT electrode with the $SiO_2$ film 6, as described above. In addition, as shown in FIG. 10, when the $SiO_2$ film 6 is designed to be relatively thick in order to suppress spurious responses at high temperatures, degradation of the minimum insertion loss can also be effectively suppressed. Thus, the thickness of the $SiO_2$ film is preferably relatively large. It has been confirmed through experiments conducted by the inventor of the present invention, as shown in FIG. 10, for the range of about 70 nm or less, degradation of the minimum insertion loss can be effectively suppressed by adjusting the thickness of the $SiO_2$ film within the range of about 40 nm to about 70 nm. At a thickness exceeding about 70 nm, the insertion loss may be degraded due to the mass of the $SiO_2$ film.

When the thickness of the $SiO_2$ film is set to about 70 nm, for example, degradation of the insertion loss is suppressed to a greater extent when the thickness of the IDT electrode composed of aluminum is set to about 6.3% of the wavelength $\lambda$ than when the thickness is set to about 6.8% of the wavelength $\lambda$. This is because when the IDT electrode made of aluminum is relatively thin, the degree of concentration of the surface waves in the quartz substrate surface is relatively low such that the surface waves are not easily affected by the disturbance at the substrate surface, e.g., the $SiO_2$ film.

As shown by the experimental examples described above, the thickness of the IDT electrode made of aluminum is preferably adjusted in the range of about 6.0% to about 6.5% of the wavelength $\lambda$, for example, in order to suppress degradation of the insertion loss and spurious responses at high temperatures, as shown in FIGS. 7 and 8. FIG. 8 shows that the minimum insertion loss is degraded at a thickness less than about 6.0%. At a thickness exceeding about 6.5%, a large spurious response occurred similar to the case of about 6.8% as shown in FIG. 6.

As shown in FIG. 9, degradation of the minimum insertion loss can be suppressed by adjusting the duty ratio of the IDT electrode to at least about 0.62, for example. At a duty ratio exceeding about 0.66, the formation of electrodes by photolithography becomes difficult.

In the aforementioned preferred embodiment, the cut angle $\theta$ of the quartz substrate 2 is preferably set to about −52°30′, for example. However, it has been confirmed that degradation of the insertion loss can be suppressed as in the above-described preferred embodiment while suppressing the spurious response at high temperatures if the cut angle $\theta$ is within the range of about −53° to about −52°, for example.

Figure 2:
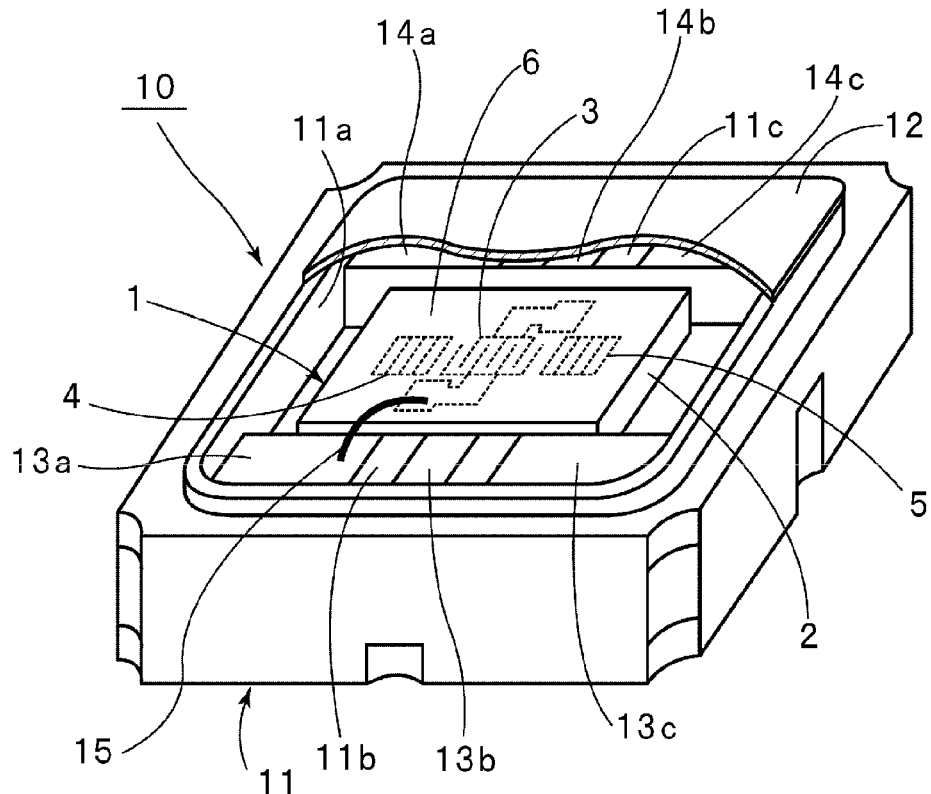
FIG. 2 is a partial cut-away perspective view of a surface acoustic wave device including the surface acoustic wave resonator of the preferred embodiment of the present invention shown in FIG. 1.

The surface acoustic wave resonator 1 of this preferred embodiment is preferably included in a surface acoustic wave device 10 shown in FIG. 2, for example. The surface acoustic wave device 10 includes a package main body 11 and a cover 12. The package main body 11 is preferably made of an insulating material, e.g., an insulating ceramic or synthetic resin, for example. The surface acoustic wave resonator 1 includes an opening 11a opening upward. The package main body 11 is disposed inside the opening 11a and fixed to the bottom surface of the package main body 11. Steps 11b and 11c are provided at the sides of the surface acoustic wave resonator 1 inside the opening 11a. The steps 11b and 11c are lower than the upper surface of the package main body 11. Electrode lands 13a to 13c are disposed on the upper surface of the step 11b and electrode lands 14a to 14c are disposed on the upper surface of the step 11c. These electrode lands 13a to 13c and 14a to 14c are preferably connected to the IDT electrode 3 of the surface acoustic wave resonator 1 via a bonding wire 15, for example.

The opening 11a is preferably covered with the cover 12 to hermetically seal the surface acoustic wave resonator 1.

The cover 12 is preferably defined by a metal plate coated with a conductive coating such as a plating film, for example. During assembly to place the cover 12 on the opening 11a of the package main body 11, the conductive material on the surface of the cover 12 may cause a short-circuit if it is scattered by impacts or other external forces and is disposed on the IDT electrode 5. According to the surface acoustic wave resonator of the present preferred embodiment, such a short-circuit is prevented because the $SiO_2$ film 6 is arranged to cover the IDT electrode 5.

Moreover, the problems associated with a structure having a $SiO_2$ film 6, i.e., the occurrence of a spurious response, the exact causes of which are unknown, at a high temperature as described above, can be easily and assuredly prevented according to preferred embodiments of the present invention. Thus, a highly reliable surface acoustic wave resonator that is suitable for use in a surface acoustic wave device 10 having a package structure can be provided according to preferred embodiments of the present invention.

Accordingly, the surface acoustic wave resonator 1 and the surface acoustic wave device 10 according to preferred embodiments of the present invention are suitable for uses that may involve exposure to low temperatures and to high temperatures of about 125° C. Examples of such usages include an oscillator of a keyless entry system for automobiles in which reliability in an environment of about −40° C.

to about +85° C. is required and an oscillator of a direct tire-pressure monitoring system in which reliability in the temperature range of about −40° C. to about +125° C. is required.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave resonator comprising:
    a rotated Y-cut quartz substrate with a cut angle θ of about −53° to about −52°;
    an IDT electrode provided on a main surface of the quartz substrate, the IDT electrode being made of aluminum or an alloy primarily including aluminum; and
    a $SiO_2$ film arranged to cover the main surface of the quartz substrate and the IDT electrode; wherein
    a propagation direction of surface acoustic waves is within a range of about 90°±5° with respect to the X axis; and
    a thickness of the IDT electrode is in a range of about 6.0% to about 6.5% of λ, where λ is the wavelength of surface acoustic waves propagating in the quartz substrate, and a duty ratio of the IDT electrode is in the range of about 0.62 to about 0.66.

2. The surface acoustic wave resonator according to claim 1, wherein the thickness of the $SiO_2$ film is in a range of about 20 nm to about 70 nm.

3. A surface acoustic wave device comprising:
    the surface acoustic wave resonator according to claim 1; and
    a packaging member arranged to house the surface acoustic wave resonator and to hermetically seal the surface acoustic wave resonator.

4. The surface acoustic wave device according to claim 3, wherein the packaging member includes a package main body having an opening in which the surface acoustic wave resonator is disposed, and a cover arranged to close the opening of the package main body, the surface of the cover being coated with a conductive material.

* * * * *